US006755953B2

(12) United States Patent
Baba

(10) Patent No.: US 6,755,953 B2
(45) Date of Patent: Jun. 29, 2004

(54) METHOD FOR FORMING ORDERED STRUCTURE OF FINE METAL PARTICLES

(75) Inventor: Masakazu Baba, Minato-ku (JP)

(73) Assignees: NEC Corporation, Tokyo (JP); Japan Science and Technology Corporation, Saitama (JP)

( * ) Notice: Subject to any disclaimer, the term of this patent is extended or adjusted under 35 U.S.C. 154(b) by 99 days.

(21) Appl. No.: 10/149,547

(22) PCT Filed: Dec. 7, 2000

(86) PCT No.: PCT/JP00/08638

§ 371 (c)(1),
(2), (4) Date: Jun. 12, 2002

(87) PCT Pub. No.: WO01/43196

PCT Pub. Date: Jun. 14, 2001

(65) Prior Publication Data

US 2002/0189952 A1 Dec. 19, 2002

(30) Foreign Application Priority Data

Dec. 13, 1999 (JP) .......................................... 11-352965

(51) Int. Cl.⁷ ................................................ C25D 1/00
(52) U.S. Cl. ........................ 205/74; 205/109; 205/110; 205/205
(58) Field of Search ................................. 205/109, 110, 205/205, 74

(56) References Cited

FOREIGN PATENT DOCUMENTS

WO    WO 97/36333 A1    10/1997

OTHER PUBLICATIONS

T. Sato et al, "Nucleation and growth of nano–gold colloidal lattices", *Chem. Commun.*, No. 11, 1997, pp. 1007–1008, no month.

T. Sato et al, "Observation of a Coulomb staircase in electron transport through a molecularly linked chain of gold colloidal particles", *Appl. Phys. Lett.*, vol. 70, No. 20, May 1997, pp. 2759–2761.

T. Sato et al, "Single electron transistor using a molecularly linked gold colloidal particle chain", *J Appl Phys.*, vol. 82, No. 2, Jul. 1997, pp. 696–701.

R.P. Andres et al., "Self–Assembly of a Two–Dimensional Supperlattice of Molecularly Linked Metal Clusters", *Science*, vol. 273, Sep. 1996, pp. 1690–1693.

R. Resch et al., "Building and Manipulating Three–Dimensional and Linked Two–Dimensional Structures of Nanoparticles Using Scanning Force Microscopy", *Langmuir*. vol. 14, No. 23, Nov. 1998, pp. 6613–6616.

*Primary Examiner*—Wesley A. Nicolas
(74) *Attorney, Agent, or Firm*—Sughrue Mion, PLLC

(57) ABSTRACT

In order to preventing thiol-coated metal particles from being liberated from a self-aligning membrane on a substrate during coating the metal particles deposited on the self-aligning membrane with thiol molecules, this invention provides a process for forming a metal particle ordered structure wherein a voltage is applied on the substrate for preventing the metal particles from being liberated from the self-aligning membrane during coating the metal particles deposited on the self-aligning membrane on the substrate with thiol molecules.

9 Claims, 5 Drawing Sheets

After Thiol treatment
The number of particles: 107
15 Voltage V

Before Thiol treatment
The number of particles: 107
15 Voltage V

Deposition state of particles on the substrate surface

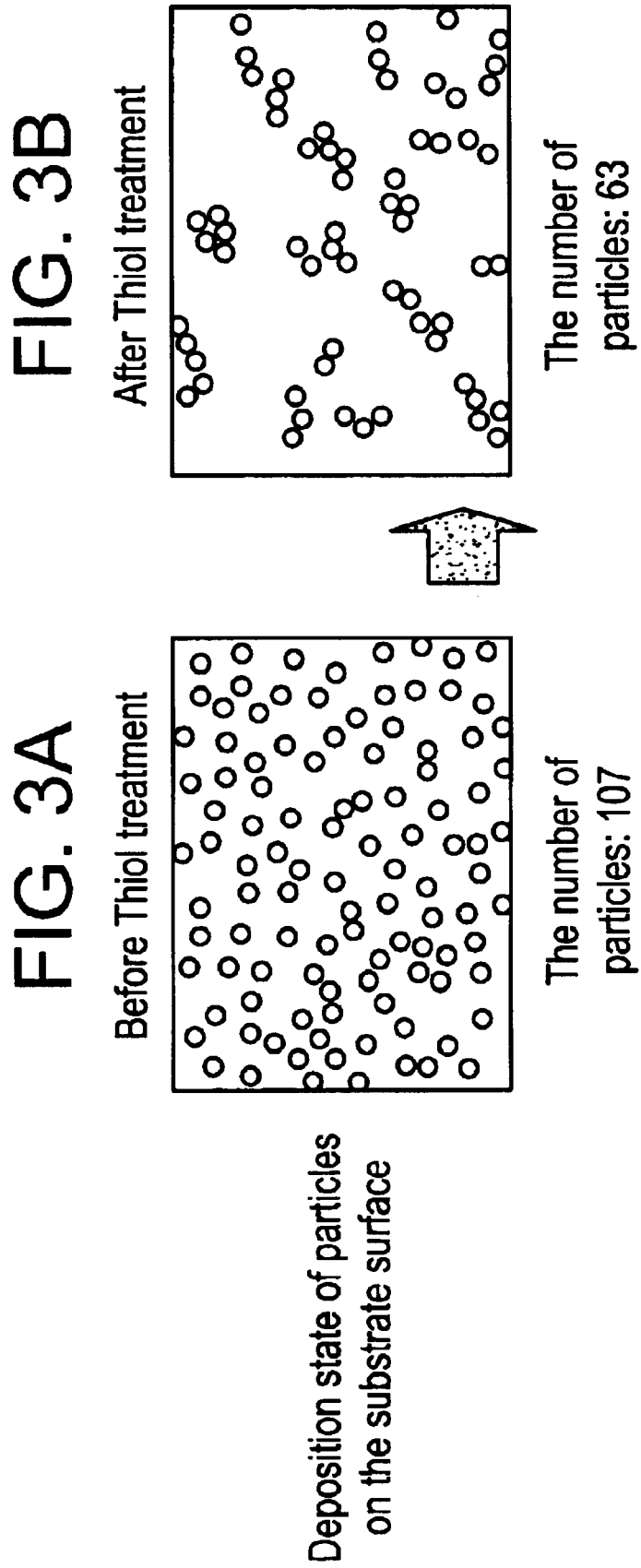

Schematic figure of relationship between SAM molecules and gold particles

METHOD FOR FORMING ORDERED STRUCTURE OF FINE METAL PARTICLES

BACKGROUND OF THE INVENTION

1. Field of the Invention

This invention relates to a process for treating metal particles deposited on a substrate with an organic solvent. In particular, it relates to a process for forming a two-dimensional ordered structure of metal particles deposited on a self-aligning membrane.

2. Description of the Prior Art

A single-electron device controls electrons to a single electron level utilizing a "coulomb blockade" phenomenon where coulomb energy inhibits tunneling of electrons. A single-electron device has the following excellent properties.

(a) A temperature at which the device can operate increases as its size is reduced.

(b) A conductor or semiconductor material can be used.

(c) Since it can control a single electron, a power consumption is also reduced to one several ten thousandth compared to that for a conventional device.

In order to operate such a single-electron device at a room temperature, its capacitance must be a level of $10^{-18}$ F., which indicates a device size of several nanometers. There have been various attempts to construct an ordered structure with such a size, but no satisfactory processes have not been discovered.

The following two types of processes have been mainly studied for constructing an ordered structure in a nanometer level.

(i) Processes employing conventional lithography; and (ii) Processes forming a fine structure in a self-aligning manner.

The lithography technique described in (i) has been developed to a level that a pattern with a size of about $1/10 \mu m$ can be processed. It, however, is not adequate for processing with good reproductivity in a several nm level. Drawing with a convergent electron beam has been mainly investigated. However, drawing with an electron beam, in which each pattern must be drawn with an electron beam, has drawbacks, e.g., that a throughput may be reduced and that an ordered structure formed may be damaged during electron-beam drawing.

Much attention has been paid to the process in (ii) above forming an ordered structure in a self-aligning manner, which depends on advance in study for metal particles with a size range of several nm to several ten nm and their agglomerates (clusters) in the fields of organic chemistry and catalyst chemistry.

An ordered structure used for a single-electron device may be made of a conductor in a nanometer level. Thus, this process applies metal particle agglomerates with a size of several nm to a single-electron device. A particularly noticeable process is that metal particles are coated with thiol molecules to form metal thiol particles.

Metal particles with a size of several nm are highly reactive because of a larger ratio of a surface area to a volume so that they may agglomerate when being left as they are. Metal particle surfaces are, therefore, coated with thiol molecules to prevent the metal particle from agglomerating.

Metal particles may be deposited on a substrate by first dropping a solution of metal thiol particles and then drying it. This process, however, has a drawback that the number of metal particles constituting an agglomerate (cluster) and pattern forming of an agglomerate (cluster) cannot be controlled.

A further advanced process is, for example, that metal particles are deposited on an SAM made of organic molecules; and the metal particles are treated with thiol and then dispersed on the SAM to form an ordered structure as described in T. Sato, D. Brown, F. G. Johnson, Chem. Commun., 1007 (1997).

The process will be described with reference to FIG. 3, in which a metal employed is gold.

On a silicon oxide film is formed an SAM using APTS (3-(2-amino-ethylamino)propyltrimethoxysilane). The substrate is immersed in a solution containing gold particle colloid (gold colloid solution) separately prepared to deposit the gold colloid on the SAM. Then, a loose electrostatic bond is formed between the amino group in APTS and the surface of the gold colloid so that the gold colloid is fixed on the SAM (FIG. 3(c)).

The term "gold colloid" as used herein refers to each gold colloid particle.

Gold colloids have a positive charge and thus repulse each other, so that they exist apart from each other by a distance depending on a charge on the colloids, without forming an agglomerate (cluster). At this stage, gold colloids cannot be bound each other to form an agglomerate (cluster). Furthermore, the maximum number for gold colloid per a unit area of a substrate on which they are loaded is limited (FIG. 3(a)).

After the treatment, the SAM on which gold colloids are loaded is immersed, together with the substrate, in a thiol solution to coat the metal particle surface with the thiol molecules.

A sulfur atom in a thiol molecule is very apt to be bound to gold. Specifically, a thiol molecule cleaves a loose electrostatic bond between a gold colloid and the amino group in the SAM to form a covalent bond with gold. Thus, gold particles are coated with thiol molecules to provide gold thiol particles (FIG. 3(d)).

Once coated with thiol molecules, gold thiol particles can be dispersed on the SAM surface. Thus, the gold thiol particles are dispersed while being bound each other via van der Waals force to form a two-dimensional ordered structure when being in contact with each other (FIG. 3(b)).

According to this conventional process, silver or platinum can be used as a metal to provide a two-dimensional ordered structure on an SAM.

As described above, this process is adequately sophisticated to provide a metal particle ordered structure with a size of several nm with good reproductivity.

A cycle of metal particle adhesion and thiol treatment may repeated to increase the number of metal particles on the SAM surface for providing a two-dimensional ordered structure with an extent comparable to the substrate area.

The process of the prior art has a drawback that metal particles loaded on the SAM are detached from the SAM during thiol treatment. Although it depends on some factors such as treatment conditions and the size of the metal particles, all metal particles loaded may be sometimes detached. It is because a "bond between a thiol molecule and a metal particle" is formed during thiol treatment so that an electrostatic bond between a metal colloid and an amino group in the SAM is cleaved. Then, metal particles which have been bound to the SAM surface are liberated so that they can be dispersed on the SAM. At the same time, an electrostatic bond is, however, lost so that a force binding metal thiol particles on the SAM becomes weaker and the metal thiol particles begin to be liberated in the solution.

Using gold as a metal, liberation of gold thiol particles from an SAM was significant when the size of the metal particles was less than 10 nm. Furthermore, when the size of the metal particles was 1 nm or less, metal particles little remain on a substrate. It was, therefore, very difficult to form an ordered structure.

FIGS. 3(a) and (b) schematically show such states. It is assumed that 107 metal particles exist on an SAM before thiol treatment. After thiol treatment, an ordered structure in which the metal thiol particles agglomerate is formed on the SAM while about a half of the metal thiol particles are detached from the SAM, so that only 63 particles remain.

SUMMARY OF THE INVENTION

In view of these problems, an objective of this invention is to prevent metal thiol particles from being detached from an SAM during coating metal particles deposited on the SAM with thiol molecules.

Another objective of this invention is to effectively form a metal particle ordered structure on an SAM without losing metal particles. A further objective of this invention is to provide a process for forming a metal particle ordered structure in which the size of the ordered structure of metal particles is adjustable.

This invention proposes a process for forming a metal particle ordered structure on a substrate, comprising the steps of:

(1) immersing a metal oxide film substrate in a solution containing at least APTS (3-(2-amino-ethylamino) propyltrimethoxysilane) to form a self-aligning membrane (SAM) of APTS on the substrate surface;

(2) immersing the substrate with the SAM in a solution containing metal particle colloid with a particle size (D) of $0.8 \leq D \leq 10$ nm to load metal colloids on the SAM surface;

(3) immersing the substrate on whose SAM surface metal colloids are loaded, in a solution containing at least a material having a thiol group to thiolate the metal particles for providing metal thiol particles; and (4) applying a given voltage between the substrate where metal colloids are loaded on the SAM surface as the first electrode and the second electrode in the solution while conducting the above step (3).

According to this invention, when treated metal colloids pre-loaded on an SAM with a thiol, a voltage can be applied between a substrate and a thiol solution to prevent metal thiol particles from being liberated from the SAM by the action of electrostatic attraction between the metal thiol particles and the substrate.

According to the prior art, as the size of metal particles decreases, after the thiol treatment the amount of the particles liberated from the SAM increases. It has been, therefore, very difficult to keep metal particles with a small size on the SAM. When using, for example, gold as a metal, gold particles with a size of 1 nm or less cannot be practically kept on an SAM.

According to this invention, however, even gold particles with a size of 1 nm or less it becomes possible to be easily kept gold thiol particles on an SAM.

In this invention, metal particles liberated from an SAM are less than the prior art. This invention can, therefore, eliminate loss of metal particles to effectively form a metal particle ordered structure.

A voltage applied between the substrate and the thiol solution may be varied to adjust an effective moving length of the metal thiol particles on an SAM and thus to easily control the size of the metal particle two-dimensional ordered structure. The term "effective moving length" of metal thiol particles as used herein means a moving distance per a unit time of the metal thiol particles on an SAM, indicating diffusibility of the metal thiol particles on the SAM. A longer effective moving length indicates that metal thiol particles can be more easily diffused on an SAM.

Specifically, a lower applied voltage during thiol treatment allows individual metal thiol particles to more easily move on an SAM, i.e., a longer effective moving length. A probability of collision between metal thiol particles is, therefore, increased. In this case, a large two-dimensional ordered structure may be easily formed even with a small number of particles.

On the other hand, a higher applied voltage restricts movement of individual metal thiol particles on an SAM, i.e., a shorter effective moving length. A probability of collision between metal particles on the substrate is, therefore, reduced so that a small two-dimensional ordered structure may be formed even with a large number of particles.

An effective moving length depends on the size of metal particles. If the other conditions are identical, a larger particle size gives a smaller effective moving length of metal thiol particles.

As described above, this invention allows the size of a two-dimensional ordered structure and its surface density to be controlled via the size of metal particles and an applied voltage.

BRIEF DESCRIPTION OF THE DRAWINGS

FIG. 3A–FIG. 3D schematically show deposition of metal particles and forming an ordered structure according to the prior art.

In FIG. 1C, FIG. 1D and FIG. 2, 11 is an SAM; 12 is a gold colloid; 13 is a substrate; 15 and 23 are power supplies; 16 is a gold thiol particle; 21 is a counter electrode; 22 is a substrate; and 24 is an alcohol solution of a thiol.

DETAILED DESCRIPTION OF PREFERRED EMBODIMENTS

Figure 1B:
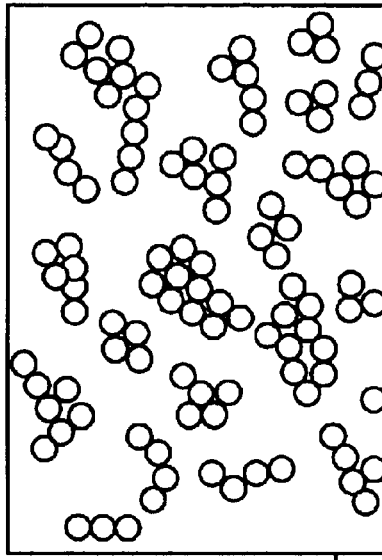
FIG. 1A–FIG. 1D schematically show forming a metal particle ordered structure according to this invention.

A suitable substrate for forming an SAM may be a metal oxide film having a hydroxyl group for reacting with APTS on its surface, including a titanium dioxide film, a nickel oxide film, an alumina film, quartz and glass. Silicon oxide is particularly suitable because a silicon single crystal with good quality is readily available.

Metal particles used in this invention preferably have a particle size within a range of 0.8 nm to 10 nm.

Without voltage application, an electrostatic force binding metal thiol particles to an SAM is substantially equivalent to ambient thermal fluctuation so that the metal thiol particles may be detached from the SAM by small stimulation.

A voltage may be applied during thiol treatment, as in the present invention, to reinforce an electrostatic force maintaining a bond between an SAM and a metal thiol particle so that metal thiol particles mainly comprised of those with a size of 10 nm or less, which may be liberated in the prior art, can be bound on the surface.

The lower limit of 0.8 nm is a temporary value, which is the minimum size of metal particles which we could obtain (Nanoprobes, Inc., gold particles, an average particle size of 0.8 nm). According to our evaluation, no gold particles were not liberated from an SAM even for gold particles with a size of 0.8 nm. It may indicate that this invention is effective in preventing gold particles with a size of less than 0.8 nm from being liberated from an SAM.

A thiol molecule for coating to form metal thiol particles may be selected from those having a saturated aliphatic hydrocarbon or aromatic hydrocarbon chain, including dodecanethiol, hexanethiol and benzenethiol. Our investigation results indicate that as the length of a hydrocarbon chain in the thiol increases, a higher voltage is required to restrict metal thiol particles on an SAM. According to our evaluation, for the purpose of restriction of metal thiol particles on a substrate, the carbon number may be desirably 8 to 14 when using a straight saturated aliphatic hydrocarbon chain.

The chain length of a thiol molecule is also related to diffusibility of metal thiol particles coated with thiol molecules on an SAM, i.e., tendency to detachment from the SAM.

We have studied the carbon number in a thiol molecule in terms of diffusibility on an SAM, using gold particles with a size of 2 to 3 nm which are most promising for preparing a single-electron device, and have obtained good results with the carbon atom number of 10 to 12. Good results herein mean that gold particles were not liberated from an SAM while a gold particle ordered structure was rapidly formed on the SAM.

The carbon number in a thiol molecule defines a distance between metal particles in a two-dimensional ordered structure, which is a determinant factor for a tunnel barrier height in a single-electron device.

For the purpose of a tunnel barrier in a single-electron device, a desirable distance between metal particles is 1 nm or less. A chain length of a thiol molecule giving such a distance experimentally corresponds to a thiol molecule having 10 to 12 carbon atoms.

However, as described above, the evaluation results are limited to gold particles with a size of 2 to 3 nm. It is, therefore, desirable to conduct reevaluation under the conditions when the size or the type of metal particles is varied.

A solvent for dissolving thiol molecules is suitably ethanol.

Binding strength of a thiol molecule on the surface of a metal particle significantly depends on a concentration of a thiol solution. Strictly speaking, a desirable concentration of a thiol solution is 0.1 to 10 mmol/L when using dodecanethiol as a thiol molecule, probably depending on a concentration of metal particles in the solution and the type of the thiol molecules used.

When a concentration of the thiol solution is 0.1 mmol/L or more, the amount of the thiol molecules is adequate to coat metal particles, providing metal particles completely coated with thiol molecules. On the other hand, a concentration of 10 mmol/L or less may prevent micelle formation of the thiol molecules, due to which reactivity of the molecules with metal particles may be reduced.

The term "self-aligning membrane" as used in Claims refers to a membrane where the surface of a substrate is coated with a unimolecular layer of compound which has, in one end, a functional group which can react to form a bond with an atom in the substrate surface, and has, e.g., an alkyl-chain backbone. It is characterized in that since the functional group binds to an atom in the substrate surface, a lattice period in molecule adsorption is an integral multiple of that for atoms in the substrate surface and molecules are oriented to a given direction from the substrate surface by interaction between alkyl chains in the backbone. When the substrate surface is coated with the molecules, no exposed atoms are present in the substrate surface, and then deposition of the molecules constituting the self-aligning membrane comes to end after forming a unimolecular layer.

The term "ordered structure" as used herein refers to a structure formed by two-dimensional agglomeration of metal particles on an SAM.

The above given voltage may be desirably such that the metal thiol particles can be diffused on the self-aligning membrane while the metal thiol particles are not detached from the substrate surface.

The configuration of this invention is characterized in that effect of inhibiting detachment of metal thiol particles is independent of polarity of a voltage applied to an electrode. Equivalent effect may be obtained whether the substrate is an anode or cathode during voltage application. However, as an applied voltage is increased, liberation of metal particles from an SAM becomes more difficult, which indicates that a force acting on the metal particles may be electrostatic.

It may be because of some mechanism by which metal thiol particles are always charged in a polarity opposite to that of a voltage applied to the substrate, but details are still unclear.

A voltage applied is desirably at least sufficient to prevent metal thiol particles with a size within the above range from being detached from an SAM surface, while it is desirably up to a level sufficient to allow the metal thiol particles to be two-dimensionally diffused on the SAM even when a voltage applied is large.

An applied voltage may be suitably selected, depending on some factors such as the size of metal particles, the desired size of a two-dimensional ordered structure and the type of thiol molecules covering the metal particles.

An applied voltage is desirably within a range of 0 to 5 V.

When an applied voltage is 5 V or less, even long-term voltage application may not cause adhesion of probably organic contaminants on an SAM.

It has been confirmed that an applied voltage within the above range is effective to metal thiol particles in which gold particles with a size of 0.8 to 10 nm are coated with thiol molecules.

This invention proposes a process for forming a metal particle ordered structure further comprising the step of immersing the substrate having a metal particle ordered structure formed by the above process for forming a metal particle ordered structure in a solution of a compound having at least two thiol groups to bind metal thiol particles together.

A two-dimensional ordered structure of metal thiol particles is maintained by van der Waals force between metal thiol particles. Since van der Waals force is not so strong, small stimulation may disturb the two-dimensional ordered structure when the metal thiol particles have a large size.

When a substrate after forming a two-dimensional ordered structure is immersed in a solution containing polyfunctional thiol molecules having at least two thiol groups as in this invention, a part of the monofunctional thiol molecules bound to metal thiol particles are replaced with the polyfunctional thiol molecules so that metal thiol particles are covalently bound each other, forming a more rigid two-dimensional ordered structure.

Suitable polyfunctional thiols which can be used include hexanedithiol and octanedithiol.

This invention also provides a process for forming a metal particle ordered structure comprising the steps of placing the first electrode in a solution containing metal thiol particles in which the surface of metal particles with a size D of $0.8 \leq D \leq 10$ nm are coated with a substance having at least one thiol group; placing, as the second electrode, in said solution an oxide substrate comprising a self-aligning membrane made of APTS on its surface for deposition of the metal particles; and applying a voltage between the electrodes to deposit the metal thiol particles in the solution on the substrate.

As described above, a solution containing metal particles coated with thiol molecules may be prepared in advance; a substrate as the first electrode and the second electrode may be immersed in the solution; and then a voltage may be applied to deposit on the substrate metal particles coated with thiol molecules near the substrate to form a two-dimensional ordered structure.

The above metal particles may be selected from gold, platinum and silver particles.

Figure 1A:
Figure 1A:
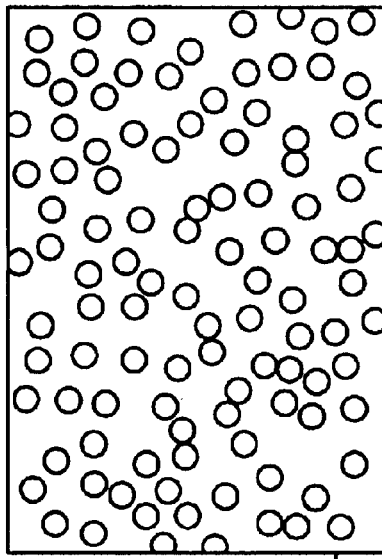
Figure 1D:
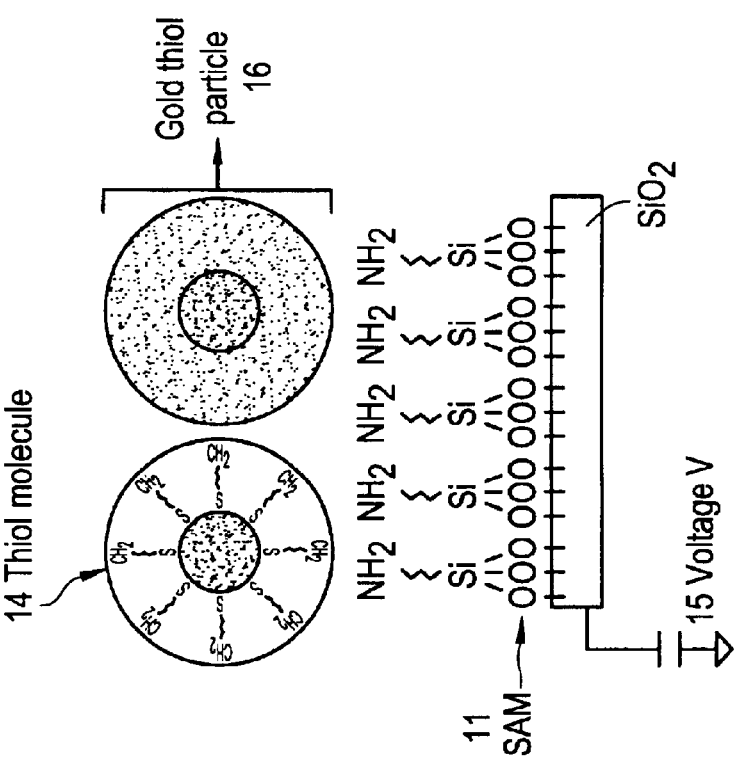
Figure 1C:
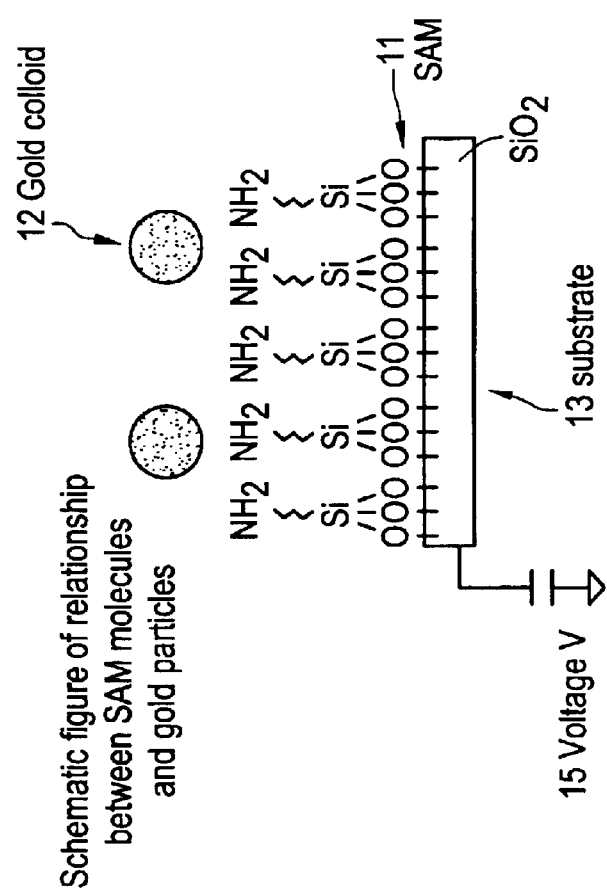
Figure 2:
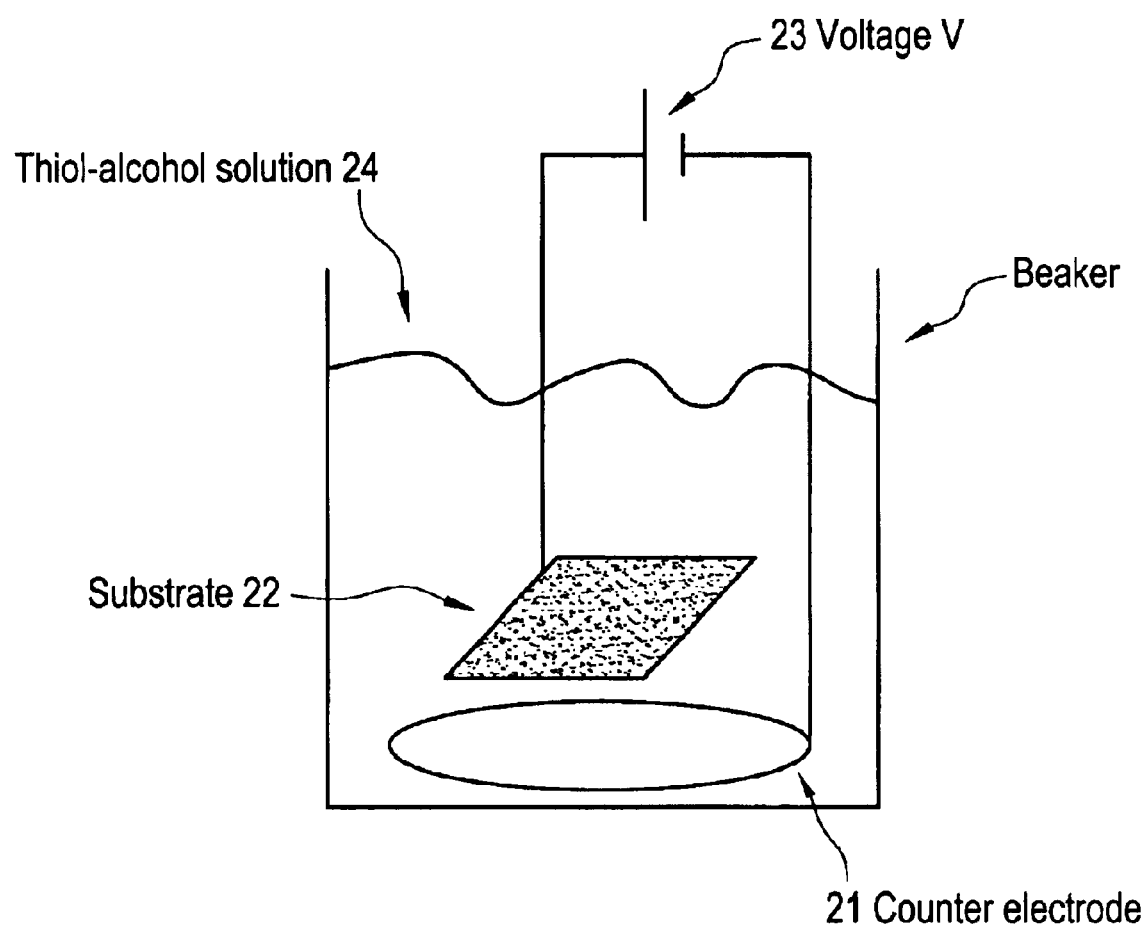
FIG. 2 schematically shows voltage application during thiol-molecule treatment according to this invention.
Figure 3D:
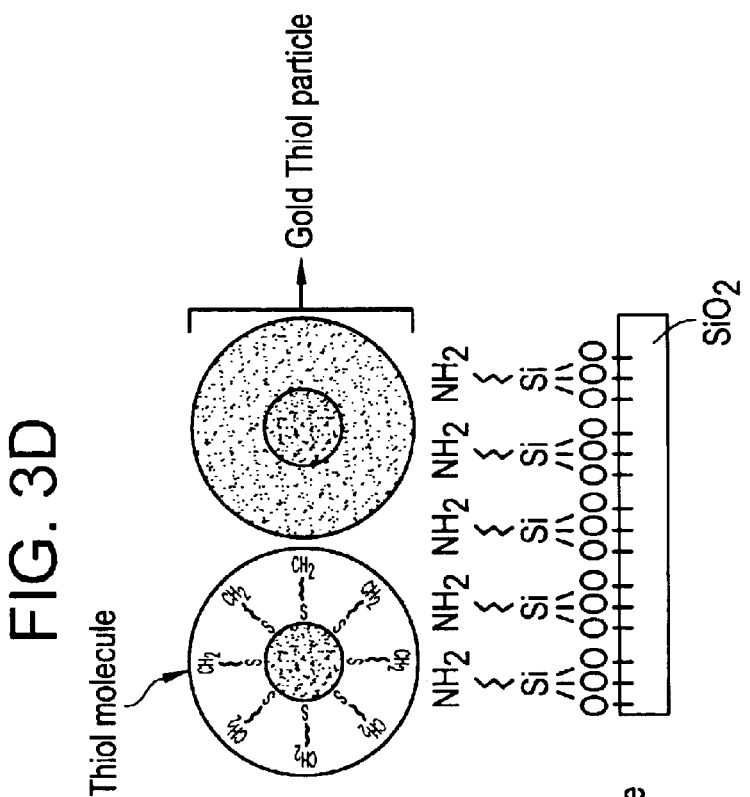
Figure 3C:
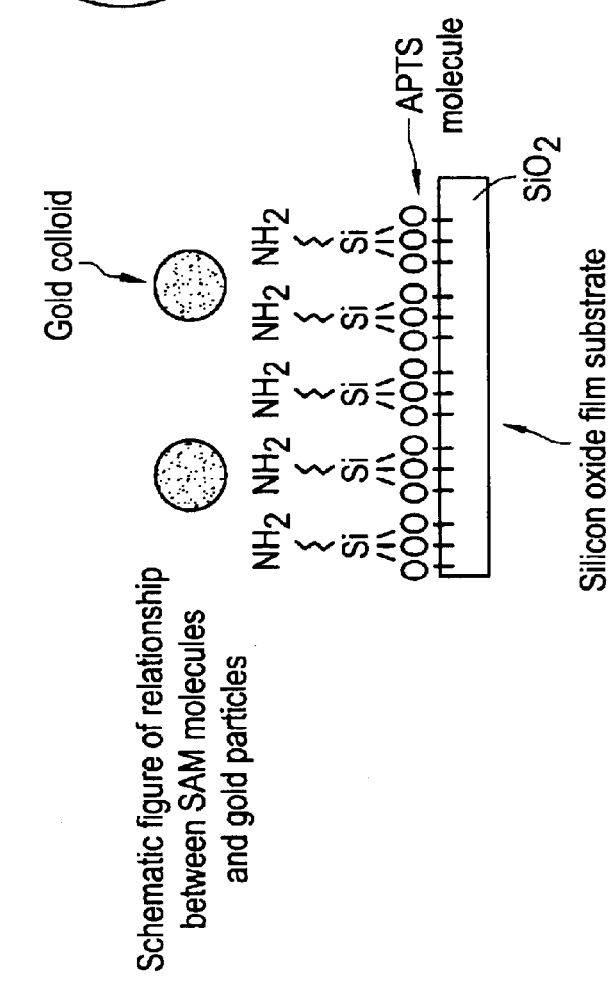

An embodiment of this invention will be described with reference to FIG. 1A–FIG. 1D. In this embodiment, gold is used as a metal particle. FIG. 1A–FIG. 1D schematically show a process for thiol treatment while applying a voltage to gold colloids deposited on a substrate. An SAM made of APTS 11 having a silane group at one end and an amino group at the other end is formed on a substrate 13 of an insulative silicon oxide film. First, the substrate is immersed in a solution containing gold colloids so that a gold colloid 12 forms an electrostatic bond with the amino group in the SAM 11 (FIG. 1A and FIG. 1C). Then, the substrate on which gold colloids 12 are deposited is treated with a thiol solution. The second electrode is placed in the thiol solution, a voltage 15 is applied to the substrate and then the substrate is immersed in the thiol solution (FIG. 2). The gold colloids 12 are coated with thiol molecules 14 to provide gold thiol particles 16, which have reduced adsorptive power with an amino group and thus may be diffused on the surface of the SAM 11 (FIG. 1D). On the other hand, gold thiol particles 16 are not liberated from the SAM 11 owing to electrostatic attraction by the applied voltage. Thus, gold thiol particles may freely move on the SAM 11 and, when colliding each other, can form a two-dimensional ordered structure by van der Waals bonding (FIG. 1B).

Effects of this invention are schematically shown in FIG. 1A and FIG. 1B. For example, a substrate in which 107 gold colloids are loaded on an SAM is treated with a thiol while applying a voltage, to coat the surface of the gold particles with the thiol to form gold thiol particles. Thus, gold thiol particles are allowed to be diffused on the SAM to form a two-dimensional ordered structure. In the prior art shown in FIG. 3A–FIG. 3D, many of gold thiol particles are liberated from an SAM during thiol treatment, whereas according to this invention, no gold particles are lost after thiol treatment.

This invention will be more specifically described with reference to, but not limited to, examples.

EXAMPLE 1

With reference to FIG. 3A–FIG. 3D and FIG. 2, an embodiment of a metal particle ordered structure formed by a process of this invention will be described.

(1) Preparation of a Substrate

A silicon oxide film was used as a substrate 13 for forming a self-aligning membrane by APTS. The film was prepared by thermally oxidizing the surface of the silicon substrate 13 to 200 nm. In the light of relationship between cleanliness of the substrate and adhesiveness of an SAM, the surface of the substrate was cleaned by $O_2$ plasma treatment.

(2) Forming an SAM on the Substrate

The substrate 13 whose surface was cleaned was immersed in an aqueous solution containing APTS (3-(2-amino-ethylamino)propyltrimethoxysilane) at 5 mmol/L for 30 min.

The surface of the silicon oxide film had many hydroxyl groups, which were bound to a silane in APTS to form an SAM 11 on the metal oxide film.

Then, the substrate 13 was washed with pure water and dried by $N_2$ gas blowing to complete bond formation between the substrate 13 and APTS.

(3) Preparation of a Gold Colloid Solution

A metal used was gold in this example.

Gold colloids was supplied as an aqueous gold colloid solution with a particle size of 5 nm (British Bio Cell Inc.).

(4) Loading of the Gold Colloids on the Substrate

The substrate 13 prepared in step (2) was immersed in the gold colloid solution from step (3) for 30 mm, whereby gold colloids 12 were adsorbed on the SAM by forming a weak electrostatic bond with an amino group. Gold colloids 12 had the same polarity so that they repulsed each other by electrostatic repulsion and thus dispersedly adsorbed on the SAM 11 while being separated each other at a certain distance (FIG. 1A).

At the end of this step, the number of gold colloid on the surface of the SAM 11 was determined by scanning electron microscopy (hereinafter, referred to as "SEM"). Then, the number of gold colloid particles per a unit area was 2000/$\mu m^2$.

(5) Thiol Treatment

Thiol treatment was conducted for coating the gold colloids with thiol molecules 14. In this treatment, a counter electrode 21 was placed as the second electrode as shown in FIG. 2 for preventing liberation of the gold thiol molecules from the surface of the SAM 11 and then the substrate was immersed in a thiol-alcohol solution 24 (a 5 mmol/L solution of dodecanethiol in ethyl alcohol) while applying a voltage 23 to the whole substrate 22 for 2 hours. During the process, a voltage applied was 3 V. Although a voltage was applied using the substrate 22 as an anode, the substrate 22 may be, on the contrary, used as a cathode.

As a result, gold thiol particles are allowed to move on the surface of the SAM 11 by weak electrostatic attraction derived from an applied voltage, but are so firmly fixed on the substrate surface that they cannot be liberated from the surface of the SAM 11. A gold thiol particle is diffused on the surface of the SAM 11 and, when being in contact with another gold thiol particle, form a bond via van der Waals force to form an ordered structure.

At the end of step (5), the ordered structure in the SEM was observed. It was then found that ordered structures in which 15 to 20 gold thiol particles were two-dimensionally agglomerated were evenly distributed on the SAM 11 at a surface density of about 100/$\mu m^2$.

The size of a gold thiol particle ordered structure can be adjusted by an applied voltage. Increase in an applied voltage causes reduction in the number of gold thiol particles contained in an ordered structure, leading to reduction in a size of the ordered structure. On the other hand, increase in an applied voltage causes increase in the number of gold thiol particles contained in an ordered structure, resulting in increase in a size of the ordered structure.

When an applied voltage was increased to 5 V, the number of gold thiol particles was 10 to 15, which was smaller than when an applied voltage was 3 V, while a surface density of the ordered structure was increased to 200/μm².

On the other hand, when an applied voltage was reduced to 1 V, so that the number of gold thiol particles contained in an ordered structure was increased to 30 to 40, which was larger than when an applied voltage was 3 V, while a surface density of the ordered structure was reduced to 30/μm².

(6) Increase in the Number of Gold Particles on the Substrate

This step may be conducted when forming an ordered structure having a large surface, and may be omitted if a gold thiol particle ordered structure can be formed with a desired size and a desired density in step (5).

The steps (4) and (5) can be repeated to increase the number of gold thiol particles on the substrate.

EXAMPLE 2

In an ethanol solution containing octanedithiol at 5 mmol/L was immersed a substrate prepared as described in Example 1 and having a two-dimensional ordered structure of gold thiol particles whose surface was coated with thiol molecules. By this treatment, a part of the thiol molecules coating the gold thiol particles were replaced and gold thiol particles in contact with each other were bound. Thus, the two-dimensional ordered structure on the substrate surface formed in Example 1 could be further reinforced.

EXAMPLE 3

A substrate comprising an SAM on whose surface gold colloids are loaded was prepared as described in steps (1) to (4) of Example 1.

(5) Treatment with a Difunctional Thiol

Unlike Example 1, the substrate prepared in step (4) was immersed in a solution of a difunctional thiol. A difunctional thiol used was a 5 mmol/L solution of octanedithiol in ethanol.

The substrate was used as an anode while a counter electrode was placed as the second electrode in the solution of octanedithiol in ethanol, and then a voltage of 3 V was applied between the electrodes for 2 hours.

As a result, SEM observation indicated that ordered structures in which 15 to 20 gold thiol particles were two-dimensionally agglomerated were evenly distributed on the SAM surface at a surface density of about 100/μm².

The two-dimensional ordered structure of gold thiol particles obtained in this example is very rigid and highly resistant to, e.g., heating because gold thiol particles are covalently bound each other.

EXAMPLE 4

A substrate comprising an SAM on its surface was prepared as described in steps (1) and (2) of Example 1.

(3) Preparation of a dispersion of Gold Thiol Particles

Commercially available gold particles with a size of 5 nm were dispersed in a 5 mmol/L solution of 1-dodecanethiol in ethanol to prepare a dispersion of gold thiol particles whose surface were coated with a thiol in advance.

(4) Placing Electrodes

A ring counter electrode 21 was placed as the second electrode in the dispersion of gold thiol particles prepared in step (3), as shown in FIG. 2. Then, the above substrate 22 comprising an SAM on its surface was immersed in the dispersion of gold thiol particles 24.

(5) Voltage Application

A DC power source 23 was connected such that the counter electrode and the substrate became an anode and a cathode, respectively, and then a voltage of 3 V was applied.

(6) Formation of an Ordered Structure

At the end of voltage application for about 10 hours, the substrate was removed and SEM observation for the surface of the SAM film indicated that ordered structures in which 20 to 30 gold thiol particles were agglomerated were formed at a surface density of 50/μm².

COMPARATIVE EXAMPLE 1

Ordered structures of gold thiol particles were formed on an SAM as described in Example 1, omitting voltage application during thiol treatment in step (5).

At the end of steps (4) and (5) as described in Example 1, SEM evaluation indicated that after thiol treatment, gold thiol particles on the SAM were reduced to 50% of the number before treatment, according to the prior art.

As described above, this invention can prevent metal thiol particles from being liberated from an SAM during coating of metal particles deposited on a substrate with thiol molecules. A voltage applied during thiol treatment may be adjusted to control the size of a metal particle ordered structure.

Furthermore, a metal particle ordered structure can be effectively formed on an SAM without losing metal particles.

What is claimed is:

1. A process for forming a metal particle ordered structure on a substrate, comprising the steps of:

(1) immersing a metal oxide film substrate in a solution containing at least APTS (3-(2-amino-ethylamino) propyltrimethoxysilane) to form a self-aligning membrane (SAM) of APTS on the substrate surface;

(2) immersing the substrate with the SAM in a solution containing metal particle colloid with a particle size (D) of $0.8 \leq D \leq 10$ nm to load metal colloids on the SAM surface;

(3) immersing the substrate on whose SAM surface metal colloids are loaded in a solution containing at least a material having a thiol group to thiolate the metal particles for providing metal thiol particles; and (4) applying a voltage between the substrate where metal colloids are loaded on the SAM surface as a first electrode and a second electrode in the solution while conducting the above step (3).

2. The process for forming a metal particle ordered structure as claimed in claim 1 wherein the applied voltage is 0 to 5 V.

3. The process for forming a metal particle ordered structure as claimed in claim 1, further comprising after step (3) immersing the substrate in a solution containing a substance comprising a thiol having at least two thiol groups to bind metal thiol particles together.

4. The process for forming a metal particle ordered structure as claimed in claim 1 wherein a certain level of voltage is applied such that the metal thiol particles are not liberated from the substrate surface while they can be diffused on the self-aligning membrane.

5. The process for forming a metal particle ordered structure as claimed in claim 4 wherein the applied voltage is 0 to 5 V.

6. A process for forming a metal particle ordered structure comprising the steps of placing a first electrode in a solution containing metal thiol particles in which the surface of metal particles with a size D of $0.8 \leq D \leq 10$ nm are coated with a substance having at least one thiol group; placing, as a second electrode, in said solution a substrate comprising a self-aligning membrane on its surface for deposition of the metal particles; and applying a voltage between the electrodes to deposit the metal particles in the solution on the substrate.

7. The process for forming a metal particle ordered structure as claimed in any one of claims 1 to 6 or 5 wherein the metal particles are gold particles.

8. The process for forming a metal particle ordered structure as claimed in any one of claims 1 to 6 or 5 wherein the metal particles are platinum particles.

9. The process for forming a metal particle ordered structure as claimed in any one of claims 1 to 6 or 5 wherein the metal particles are silver particles.

* * * * *

UNITED STATES PATENT AND TRADEMARK OFFICE
CERTIFICATE OF CORRECTION

PATENT NO.    : 6,755,953 B2
DATED         : June 29, 2004
INVENTOR(S)   : Masakazu Baba It is certified that error appears in the above-identified patent and that said Letters Patent is hereby corrected as shown below:

<u>Title page,</u>
Item [54], Title, "METHOD FOR FORMING ORDERED STRUCTURE OF FINE METAL PARTICLES" has been replaced with -- PROCESS FOR FORMING A METAL PARTICLE ORDERED STRUCTURE --.

Signed and Sealed this

Eighth Day of February, 2005

JON W. DUDAS
*Director of the United States Patent and Trademark Office*